US006242977B1

(12) United States Patent
Karsten

(10) Patent No.: US 6,242,977 B1
(45) Date of Patent: Jun. 5, 2001

(54) AMPLIFIER AND PREAMPLIFIER CIRCUIT

(75) Inventor: Ralph R. Karsten, St. Paul, MN (US)

(73) Assignee: Atma-Sphere Music Systems, Inc., St. Paul, MN (US)

( * ) Notice: Subject to any disclaimer, the term of this patent is extended or adjusted under 35 U.S.C. 154(b) by 0 days.

(21) Appl. No.: 09/320,308

(22) Filed: May 26, 1999

(51) Int. Cl.$^7$ .................................................. H03F 3/00
(52) U.S. Cl. ................................ 330/146; 330/127
(58) Field of Search ........................... 330/3, 127, 146

(56) References Cited

U.S. PATENT DOCUMENTS

| | | | |
|---|---|---|---|
| 4,229,705 | 10/1980 | Takahashi et al. | 330/258 |
| 4,229,706 * | 10/1980 | Bongiorno | 330/273 |
| 4,719,431 | 1/1988 | Karsten | 330/273 |
| 4,775,844 * | 10/1988 | Snyder | 330/146 |
| 5,003,271 * | 3/1991 | Swanson | 330/146 |
| 5,333,203 | 7/1994 | Diaz | 381/62 |
| 5,500,632 | 3/1996 | Halser, III | 336/180 |
| 5,600,575 * | 2/1997 | Anticole | 330/146 |

* cited by examiner

Primary Examiner—Robert Pascal
Assistant Examiner—Khanh Van Nguyen
(74) Attorney, Agent, or Firm—Kinney & Lange, P.A.

(57) ABSTRACT

The present invention is a circuit for use as a preamplifier or amplifier. The circuit has first and second input terminals that are configured to receive first and second balanced input signals. The circuit also includes first and second active devices that control output signals. Each of the active devices have a source, a control, and an output. In one embodiment, the control of the first active device is coupled to the first input terminal. The control of the second active device is coupled to the second input terminal. The circuit further includes first and second output terminals at which output signals are provided. The first and second output terminals are coupled to the first and second active devices. The circuit includes an coupler that couples a floating power supply to the first and second output terminals, and to the first and second active devices.

21 Claims, 4 Drawing Sheets

AMPLIFIER AND PREAMPLIFIER CIRCUIT

BACKGROUND OF THE INVENTION

The present invention relates to electronic signal amplifier circuits. In particular, the present invention is an audio frequency preamplifier that boosts the magnitude of signals obtained from an audio source, or instrumentation source in a similar frequency range, to form input signals for an audio frequency power amplifier that can be directly connected thereto without use of capacitors or coupling transformers. The present invention circuitry arrangement can also be used for a power amplifier that boosts the magnitude of audio frequency signals obtained from a preamplifier.

Preamplifier and power amplifiers for audio frequency signals are well known in the prior art. For example, U.S. Pat. No. 4,229,706 granted to Bongiorno in October 1980 and U.S. Pat. No. 4,719,431 granted to Karsten in January 1988 both disclose power amplifiers for this purpose. Some preamplifiers have been shown to be advantageous in being capable of transferring output signals therefrom over a balanced line interconnection arrangement directly connected thereto at its output. For example, the so called "Circlotron" circuit is such a high performance preamplifier.

An audio power amplifier 10 of the prior art, the "Circlotron" circuit, is illustrated in the FIG. 1. Power amplifier 10 includes first and second triode electron tubes 12 and 14 and first and second power supplies 16 and 18. Power amplifier 10 also includes first and second input terminals 20 and 22 as well as first and second output terminals 24 and 26. An output load 28 in operation is placed across the first and second output terminals 24 and 26. Finally, power amplifier 10 includes first and second stabilizing resistors 30 and 32 as well as first and second reference output resistors 34 and 36.

First and second power supplies 16 and 18 are constant polarity floating power supplies, that is, they do not have a ground reference with respect to the outputs thereof connected in power amplifier 10. Power supplies 16 and 18 include input terminals 17 and 19 suited for connection to ordinary 60 Hz single phase commercial alternating current (ac) sources, power transformers 21 and 23, full-wave bridge and rectifiers 25 and 27. Sources connected to terminals 17 and 19 provide a sinusoidal voltage waveform of substantially fixed amplitude to power amplifier 10. Power transformers 21 and 23 step down the voltage to an appropriate level for amplifier 10. Rectifying diode bridges 25 and 27 convert these ac waveforms to constant polarity waveforms between positive and negative output terminals having a selected nominal voltage value suited for operating the remainder of the circuit.

First triode 12 includes plate 40, grid 42, and cathode 44. Grid 42 is connected to input terminal 20 via resistor 30. Plate 40 is connected to the positive output terminal of first power supply 16. Cathode 44 is connected to first output terminal 24 and the negative output terminal of power supply 18. Second triode 14 includes plate 50, grid 52, and cathode 54. Grid 52 is connected to second input terminal 22 via resistor 32. Plate 50 is connected to the positive output terminal of second power supply 18. Cathode 54 is connected to second output terminal 26 and the negative output terminal of power supply 16. Resistor 34 is connected between first output terminal 24 and ground, and resistor 36 is connected between second output terminal 26 and ground. The cathode heater circuits for triodes 12 and 14 are not shown.

Power amplifier 10 typically receives from the input signal source in operation two balanced magnitude input voltage signals that are complements of each other, that is, one is the negative of the other ignoring the average values of each resulting from providing biasing for tubes 12 and 14. A first of these balanced input signals is received by first input terminal 20 and the second input signal is received by second input terminal 22. When the first input signal at terminal 20 is relatively high, the second input signal at terminal 22 is relatively low. Under these conditions, grid 42 of triode 12 has a relatively high voltage signal such that current increases through triode 12 to output terminal 24, and grid 52 of triode 14 has a relatively low voltage signal such that current decreases through tri ode 14 to output terminal 26 leaving a net voltage across the load. In this way, power amplifier 10 operates to amplify the difference between the first and second input signals to thereby provide a substantial differential current gain, though little voltage gain with tubes 12 and 14 each connected as cathode followers.

Audio power amplifier 10 has desirable characteristics such as wide frequency bandwidth, fast transient response and low total distortion for reasons set out below. Similarly, this design has desirable characteristics in preamplifier applications including wide frequency bandwidth, low total distortion, the ability to transfer output signals over relatively long interconnection cables, good reliability and low cost.

This design achieves wide frequency bandwidth because it has a relatively simple design that uses a small number of components. This relatively small number of components allows a circuit design with low parasitics. This design has fast transient response because, unlike other preamplifier designs, the relatively low distortion of this design allows avoiding the use of negative output signal feedback to correct distortion effects. Negative feedback introduces significant damping that inhibits transient response. Also, this design has low total distortion because the follower arrangement keeps the voltage across the load substantially in the linear portion of its characteristics, and since the signals are substantially balanced they cancel distortion effects in each other. Finally, this circuit can operate its load through relatively long interconnection cables because of its current gain and low output impedance.

However, there are still several problems to overcome even using prior art power amplifier 10. First, electrostatic noise from first and second power supplies 16 and 18 will result in noticeable amounts of noise at output terminals 24 and 26. Electrostatic noise is caused by the electrostatic coupling of the alternating current line voltage across the power transformers. Electrostatic noise tends to be a problem since even very small amounts of electrostatic coupling to the alternating current line voltage across from the power transformers can result in very noticeable amounts of noise at the output. Even where multiple electrostatic shields are used with the transformer, this typically does not eliminate all the problems. Furthermore, great care must be used in applying electrostatic shields to achieve even marginal improvement in amplifier noise reduction. The present invention greatly reduces or eliminates this problem.

In addition to this problem with power amplifier 10, average offset (DC) signal values of one polarity or the other occur at output terminals 24 and 26 due to circuit imbalances such as result from component parameter magnitude variations. Circuit imbalances may occur when there is a difference in gain between triodes that are not exactly matched or differences in voltage from the power supplies due to filter capacitor or resistor values being slightly off the proper value. The present invention also substantially overcomes these problems of the prior art.

BRIEF SUMMARY OF THE INVENTION

The present invention is a circuit for use as a preamplifier or amplifier. The circuit includes first and second input terminals configured to receive first and second input signals. The circuit also includes first and second active devices for controlling output signals. Each output control element has a source, a control, and an output. The control of the first active device is coupled to the first input terminal and the control of the second active device is coupled to the second input terminal.

The circuit further includes first and second output terminals at which output signals are provided. The first and second output terminals are coupled to the first and second active devices.

In a preferred embodiment, the circuit includes a coupler for coupling a floating power supply to the first and second output terminals, and to the first and second active devices. This coupler isolates the power supply from the first and second output terminals.

In a preferred embodiment, the circuit includes a servo circuit coupled between the first and second output terminals, and to the second input terminal. The servo circuit detects offset at the first and second output terminals and feeds back the detected offset to the second input terminal.

DETAILED DESCRIPTION

Figure 1:
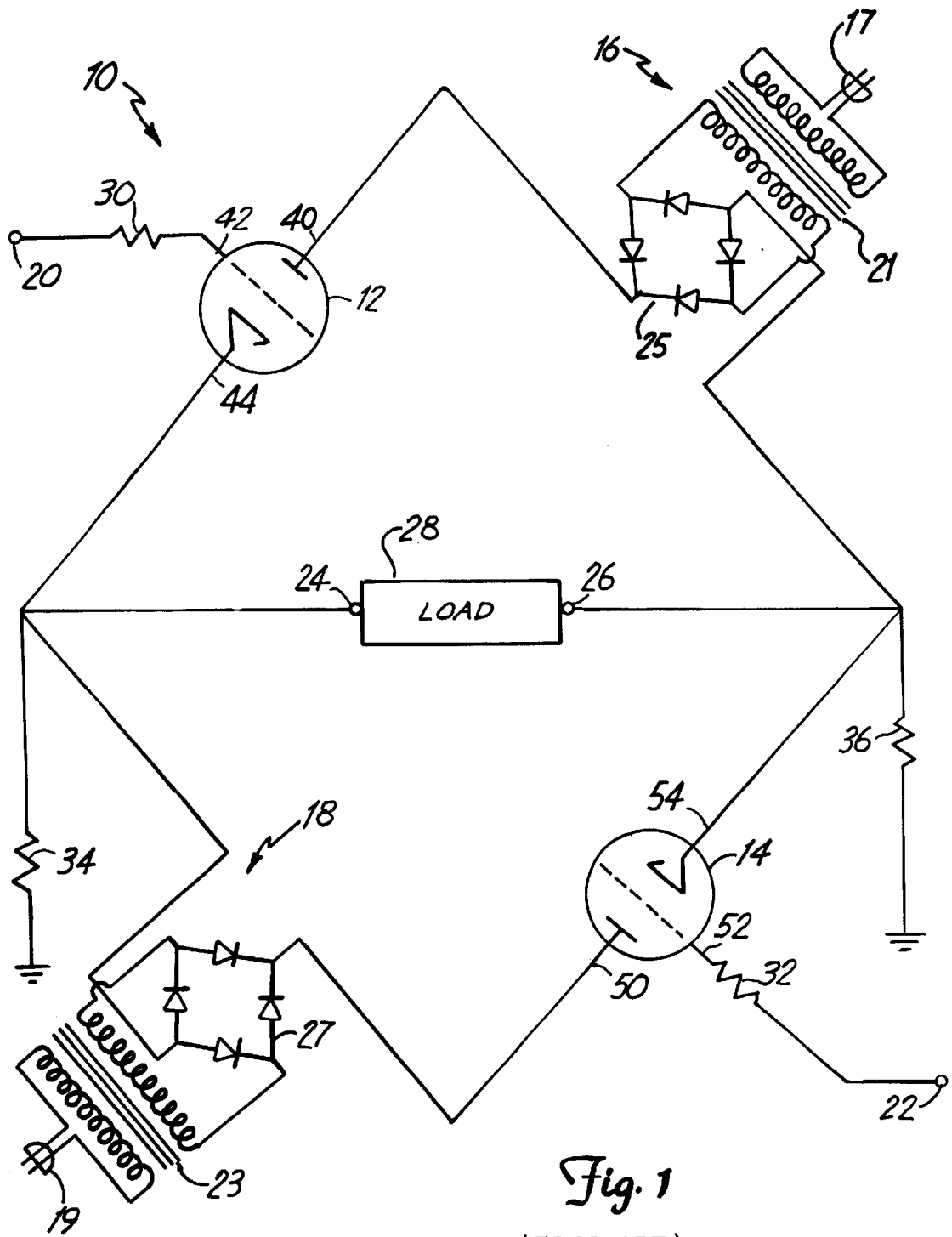
FIG. 1 is a schematic diagram representation of a power amplifier of the prior art.
Figure 2:
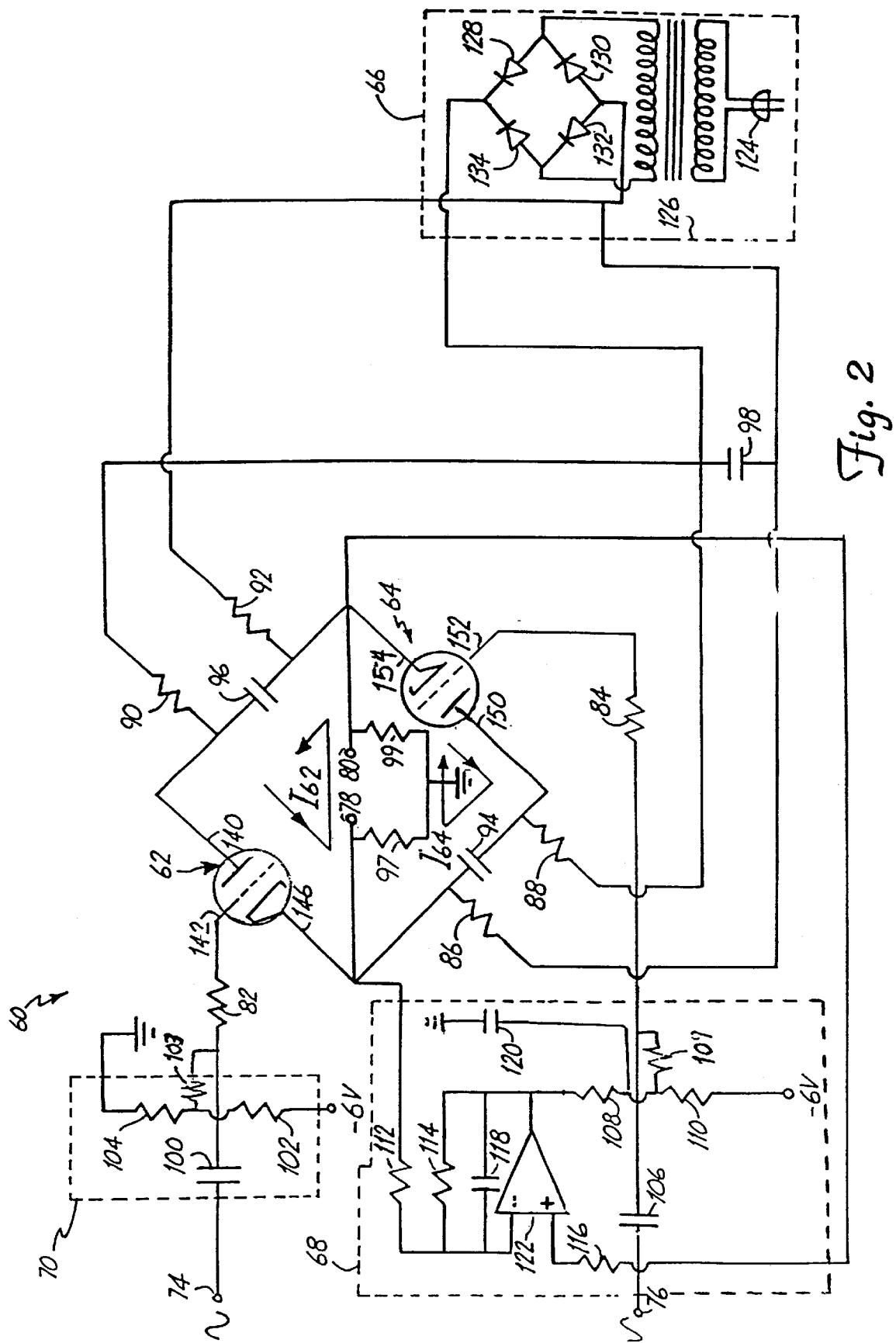
FIG. 2 is a schematic diagram representation of a preamplifier/amplifier circuit of the present invention.

Audio and instrumentation preamplifier/amplifier circuit 60 illustrates a specific embodiment of the present invention in FIG. 2. Circuit 60 includes first and second triode electron tubes 62 and 64. Circuit 60 also includes power supply 66, servo and biasing circuit 68 and biasing circuit 70. Circuit 60 further includes first and second input terminals 74 and 76 and first and second output terminals 78 and 80. Finally, circuit 60 includes first and second stabilizing resistors 82 and 84, first, second, third and fourth decoupling resistors 86, 88, 90 and 92, first, second and third decoupling voltage maintenance capacitors 94, 96 and 98, and first and second output reference resistors 97 and 99.

Biasing circuit 70 includes first input signal coupling capacitor 100 and first, second and third divider resistors 102, 103 and 104. Servo and biasing circuit 68 includes first servo loop input resistor 112, integration network resistor 114, second servo loop input resistor 116, first and second integration capacitors 118 and 120, and operational amplifier 122, which together form a low-pass filter arrangement having a selected mid-band gain. Circuit 68 also includes second input signal coupling capacitor 106 and fourth, fifth, and sixth divider resistors 108, 109 and 110.

Power supply 66 includes input terminals 124 suited for connection to an ordinary 60 Hz single phase commercial alternating current (ac) input source, power transformer 126 and a full-wave rectifying bridge circuit formed by first, second, third and fourth diodes 128, 130, 132 and 134. Terminals 124 are connected to one side of transformer 126. The other side of transformer 126 is then connected to the rectifier bridge circuit.

First triode 62 includes plate 140, grid 142 and cathode 146. Second triode 64 includes plate 150, grid 152 and cathode 154.

Grid 142 of first triode of 62 is connected to biasing circuit 70 via first optional stabilizing resistor 82. Plate 140 of first triode 62 is connected to one side of second decoupling voltage maintenance capacitor 96. Cathode 146 of first triode 62 is connected to first output terminal 78 and to one side of first decoupling voltage maintenance capacitor 94. Grid 152 of second triode 64 is connected to servo and biasing circuit 68 via second optional stabilizing resistor 84. Plate 150 of second triode 64 is connected to one side of first decoupling voltage maintenance capacitor 94. Cathode 154 of second triode 64 is connected to second output terminal 80 and to one side of second decoupling voltage maintenance capacitor 96.

First input terminal 74 is connected to biasing circuit 70, and second input terminal 76 is connected to servo and biasing circuit 68, these terminals also being connected in operation to an input signal source. Servo and biasing circuit 68 has its differential inputs connected between first and second output terminals 78 and 80. Servo and biasing circuit 68 has its output connected to grid 152 of second triode 64 via second stabilizing resistor 84.

First decoupling voltage maintenance capacitor 94 has its second side, as indicated above, connected to first output terminal 78. Second decoupling voltage maintenance capacitor 96 has its second side, also as indicated above, connected to second output terminal 80. Third decoupling voltage maintenance capacitor 98 has one side connected to the positive output terminal of power supply 66 formed by the cathodes of first and fourth diodes 128 and 134, and its second side connected to the negative output terminal of power supply 66 formed by the anodes of second and third diodes 130 and 132.

First output terminal 78 is also connected to the negative output terminal of power supply 66 via first decoupling resistor 86. Plate 150 of second triode 64 is connected to the positive output terminal of power supply 66 via second decoupling resistor 88. Plate 140 of first triode 62 is connected to the positive output terminal of power supply 66 via third decoupling resistor 90. Second output terminal 80 is connected the negative output terminal of power supply 66 via fourth decoupling resistor 92.

First output reference resistor 97 is connected between first output terminal 78 and ground. Second output reference resistor 99 is connected between second output terminal 80 and ground. An output load (not shown in FIG. 2) in operation is placed across output terminals 78 and 80.

First triode 62 has its nominal operating point set by resistors 102, 103 and 104 in biasing circuit 70 which provide a fixed bias voltage to grid 142. The nominal operating point for second triode 64 is set by resistors 108, 109 and 110, which provide a bias voltage to grid 152 subject to being varied by the servo loop involving servo and biasing circuit 68. The operating point for second triode 64 is adjusted by the output signal of circuit 68 as derived the output signal of circuit 60 at output terminals 78 and 80. Servo and biasing circuit 68, biasing circuit 70 and the input signals (coupled by capacitors 100 and 106) apply corresponding voltages to grids 142 and 152 of first and second triodes 62 and 64.

In operation, circuit 60 receives first and second balanced magnitude input signals at input terminals 74 and 76, respectively. The input signals may be audio signals, instrumentation signals in the audio frequency range, or the like. These first and second input signals are complements of each other, that is, one is the negative of the other as coupled across coupling capacitors 100 and 106. The first input signal at first input terminal 74 controls a first signal current $I_{62}$. First current $I_{62}$ runs through first triode 62 and the load across first and second output terminals 78 and 80. Similarly, the second input signal at second input terminal 76 controls a second signal current $I_{64}$. Second current 164 runs through second triode 64 and the load that is placed across output terminals 78 and 80. As shown in FIG. 2, currents $I_{62}$ and $I_{64}$ are in directions opposite one another through the load across the output terminals 78 and 80, thereby giving circuit 60 its differential current amplification characteristic.

When the first input signal at terminal 74 is relatively high, the second input signal at terminal 76 is relatively low. Under these conditions, grid 142 of triode 62 has a relatively high signal causing current 162 to increase through triode 62 and through the load across output terminals 78 and 80, and grid 152 of triode 64 has a relatively low signal causing current 164 to decrease through triode 64 and through the load across output terminals 78 and 80. In this way, circuit 60 operates to amplify the difference between the first and second input signals to again provide a substantial differential current gain, though little voltage gain with triodes 62 and 64 connected as cathode followers.

Circuit 60 has desirable amplifier and preamplifier characteristics such as wide frequency bandwidth, fast transient response, low total distortion, the ability to transfer output signals over relatively long interconnection cables, good reliability and low cost. These follow for the reasons given above.

In addition, any electrostatic noise produced at power supply 66 does not produce noticeable amounts of noise at first and second output terminals 78 and 80. Electrostatic noise does not reach the output terminals because ac input 124 and power supply 66 are decoupled from first and second output terminals 78 and 80 by first, second, third and fourth decoupling resistors 86, 88, 90 and 92, as well as by first, second and third decoupling voltage maintenance capacitors 94, 96 and 98. These decoupling elements isolate any electrostatic noise coupled across by power supply 66 from the output terminals. In this way, the difference between first and second input signals on input terminals 74 and 76 is amplified at first and second output terminals 78 and 80 by circuit 60 without the introduction of significant electrostatic noise due to power supply 66.

This isolation of the electrostatic noise produced by the power supply can also be accomplished through the use of a choke, a regulator or similar decoupling elements in place of decoupling resistors 86, 88, 90 and 92 while still practicing the present invention.

In addition, circuit 60 corrects time average (DC) voltage offsets that are produced across first and second output terminals 78 and 80 due to circuit imbalances including component variations. Again, these imbalances may occur when there is a difference in gain between triodes that are not exactly matched or differences in voltage from the power supplies due to filter capacitor or resistor values being slightly off the proper value. Correction of this offset is accomplished by using servo and biasing circuit 68.

Circuit 60 is configured such that when input signals are complements of each other, signals at first and second output terminals 78 and 80, because of the push-pull operation of triodes 62 and 64, are balanced across the load if the circuits with these triodes have identical characteristics. This results, desirably, in the operating point, or quiescent point, for circuit 60 being established with no voltage offset in the output signals provided at these output terminals 78 and 80. This goal may not be met, and certainly, as circuit 60 operates over time, circuit imbalances including component variations due to aging will cause voltage offsets in the output signals provided at output terminals 78 and 80.

Because of the balanced configuration of circuit 60, the current through one triode leads to a voltage at one output terminal that is offset in one polarity across the load with respect to that on the other output terminal. The current through the other triode leads to a voltage across the load in the other polarity direction. The amount that one output terminal is offset in one polarity direction is equal to the amount that the opposite output terminal will be offset in the other polarity direction if the two triode circuit have identical characteristics. Circuit 60 acts to correct the resulting average (DC) voltage offset across the load that results if the characteristics of these triode circuits differ.

First and second output terminals 78 and 80 are connected to the differential inputs of servo and biasing circuit 68 so that the load is across these inputs. When a voltage offset occurs at first output terminal 78 with respect to ground, the low-pass filter arrangement in circuit 68 based on operational amplifier 122 senses this offset. Similarly, corresponding voltage offset at second output terminal 80 is sensed by this low-pass filter arrangement. If these offsets are unequal and occur at a rate to be in the passband of the low-pass filter arrangement, servo and biasing circuit 68 senses the difference result so as to generate an error voltage that is fed back through stabilizing resistor 84 to grid 152 of second triode 64 in order to counter the offset. Once this time averaged offset is corrected, the low-pass filter based on operation amplifier 122 will no longer sense an average offset, and servo and biasing circuit 68 will no longer produce an error voltage.

For example, if the signal across the load has a time average offset, considering an offset for at first output terminal 78 positive, servo and biasing circuit 68 feeds back the corresponding negative error voltage to grid 152 of second triode 64 such that this positive offset at first output terminal 78 is removed. That is, the current through triode 64 is, on the average, reduced to thereby cancel the positive offset. Similarly, a negative offset leads to the current through triode 64 being increased. In this way, a balanced output voltage is achieved across the load without any DC offset.

The components of servo and biasing circuit 68, the decoupling voltage maintenance capacitors 94, 96, and 98, and decoupling resistors 86, 88, 90 and 92 should be selected such that the time constants of the circuits charging the decoupling voltage maintenance capacitors are equal to or less than the frequency of the bandwidth of servo circuit 68. This will reduce any interaction therebetween in the low frequency passband and help stabilize the circuit. Since servo and biasing circuit 68 eliminates signal frequencies less than the bandwidth of the servo loop, voltage maintenance capacitors 94, 96 and 98 do not need to be large enough to filter out such frequencies. This means smaller capacitors can be used, which reduces cost.

In one preferred embodiment, the following component values are typically used:

| | |
|---|---|
| First and second triodes 62 and 64 | 6 S N 7 (½ for each) |
| First, second, and third decoupling voltage maintenance capacitors 94, 96 and 98 | 220 microfarads (each) |
| First, second, third and fourth decoupling resistors 86, 88, 90 and 92 and output reference resistor 97 and | 1.5 kilohms (each) |
| First and second coupling capacitors 100 an 106 and filtering capacitors 118 and 120 | .1 microfarads (each) |
| First input resistor 112 | 100 kilohms |
| Second input resistor 114 | 4.99 megohms |
| Servo resistor 116 | 100 kilohms |
| First, second, fifth and sixth divider resistors 102, 103, 109 and 110 | 1 megohms |
| Third and fourth divider resistors 104, 108 | 221 kilohms |

Figure 3:
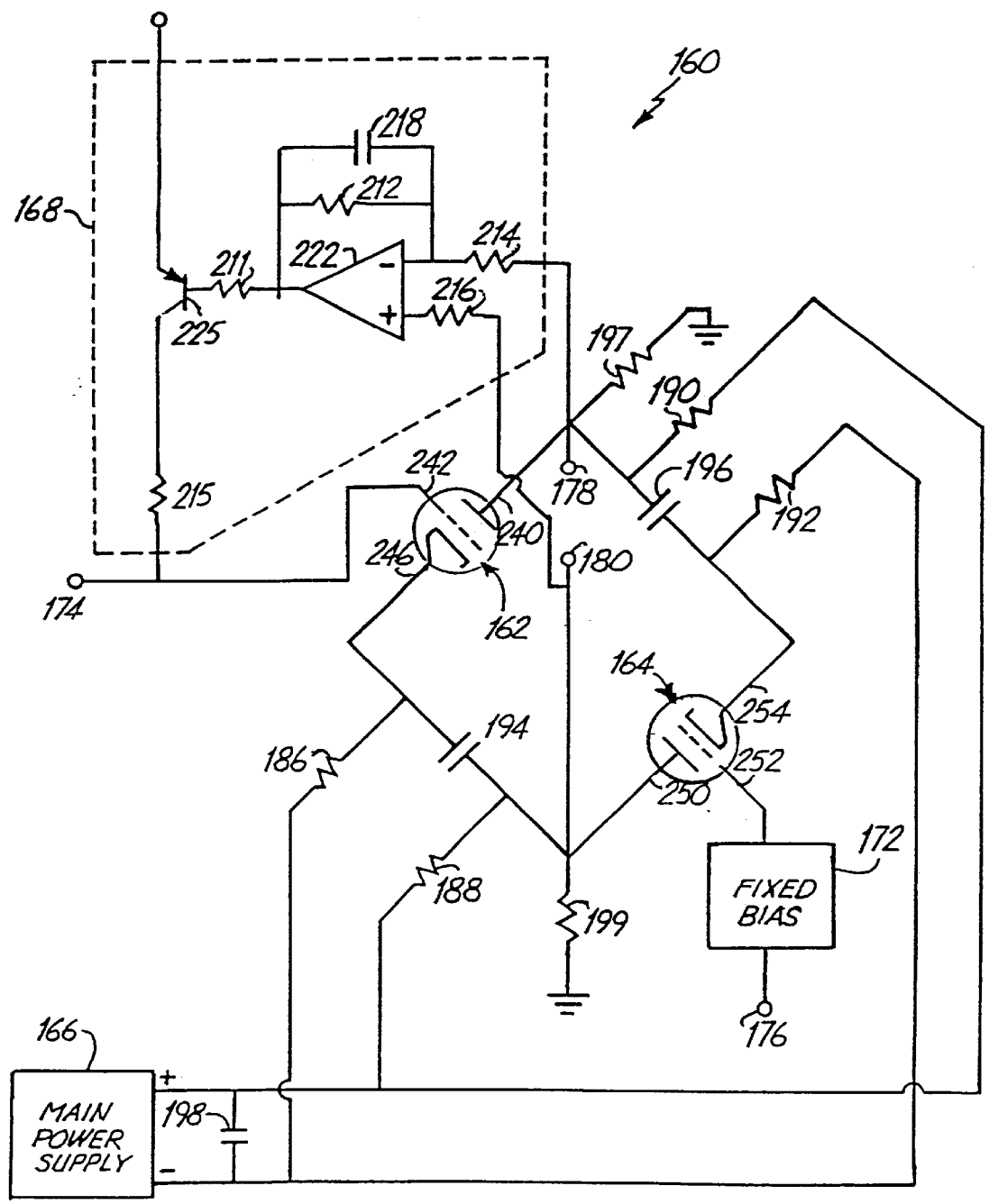
FIG. 3 is a mixed block and circuit schematic diagram representation of an alternate embodiment of the preamplifier/amplifier circuit of the present invention.

An alternative embodiment of the present invention is illustrated in FIG. 3 as audio and instrumentation preamplifier/amplifier circuit 160. Circuit 160 includes first and second triode electron tubes 162 and 164. Circuit 160 also includes power supply 166, servo and biasing circuit 168, and fixed bias circuit 172. Circuit 160 further includes first and second signal input terminals 174 and 176, which again in operation are connected to an input signal source, and first and second output terminals 178 and 180 between which in operation an output load will be placed. Finally, circuit 160 includes first, second, third and fourth decoupling resistors 186, 188, 190, and 192, first, second and third decoupling voltage maintenance capacitors 194, 196 and 198 and first and second output resistors 197 and 199.

Power supply 166 is a floating fixed polarity supply similar to power supply 66 shown in FIG. 2.

First triode 162 includes plate 240, grid 242 and cathode 246. Second triode 164 includes plate 250, grid 252 and cathode 254.

Grid 242 of first triode 162 is connected to first input terminal 174. Plate 240 of first triode 162 is coupled to first output terminal 178 and to one side of second decoupling voltage maintenance capacitor 196. Cathode 246 of first triode 162 is connected to one side of first decoupling voltage maintenance capacitor 194. Grid 252 of second triode 164 is connected to fixed bias 172. Plate 250 of second triode 164 is connected to second output terminal 180 and to one side of first decoupling voltage maintenance capacitor 194. Cathode 254 of second triode 164 is connected to one side of second decoupling capacitor 196.

The inputs of servo and biasing circuit 168 are connected between first and second output terminals 178 and 180 across the load. Circuit 168 has its output connected to first input terminal 174. Circuit 168 includes first, second, third, fourth and fifth servo resistors 211, 212, 214, 215 and 216, servo capacitor 218, operational amplifier 222, and transistor 225.

First decoupling capacitor 194 is connected between cathode 246 of first triode 162 and second output terminal 180. Second decoupling capacitor 196 is connected between cathode 254 of triode 164 and first output terminal 178. Third decoupling capacitor 198 is connected between the two output terminals of power supply 166.

First output resistor 197 is connected between first output terminal 178 and ground. Second output resistor 199 is connected between second output terminal 180 and ground. A load (not shown in FIG. 3) is placed across output terminals 178 and 180.

The operation of circuit 160 is similar to the operation of circuit 60 in FIG. 2 except that triodes 162 and 164 are connected as plate followers rather than as cathode followers. That is, one skilled in the art will recognize, circuit 60 of FIG. 2 is configured such that the load is connected between cathodes 146 and 154 of triodes 62 and 64 such that circuit 60 is a low impedance circuit. Circuit 160, however, has the load connected between the plates 240 and 250 of triodes 162 and 164 such that they are operated as plate follower circuits having low impedance outputs.

Circuit 160 has the same advantages as circuit 60. Electrostatic noise produced at power supply 166 does not produce noticeable amounts of noise at first and second output terminals 178 and 180. As was described with respect to circuit 60, decoupling components prevent the electrostatic noise from reaching the output. First, second, third and fourth decoupling resistors 186, 188, 190 and 192, as well as first, second and third decoupling capacitors 194, 196 and 198 isolate any electrostatic noise produced by power supply 166 from output terminals 178 and 180.

The circuit 160 also corrects DC voltage offsets across the load at first and second output terminals 178 and 180 in a manner similar to circuit 60. Correction of this offset is accomplished by using servo and biasing circuit 168. Circuit 160 is configured such that complementary input signals at first and second input terminals 174 and 176 cause triodes 162 and 164 to operate as a push-pull amplifier with respect to the load between first and second output terminals 178 and 180. First and second output terminals 178 and 180 are connected to input resistors 214 and 216 in circuit 168, which has its output connected back to grid 242 of first triode 162. When a DC voltage offset occurs across the load, the low-pass filter arrangement based on operational amplifier 222 of servo and biasing circuit 168 senses this offset. Circuit 168 then generates a corresponding error voltage that is fed back to grid 242 of first triode 162 to counter this offset as for circuit 68 in FIG. 2.

Figure 4:
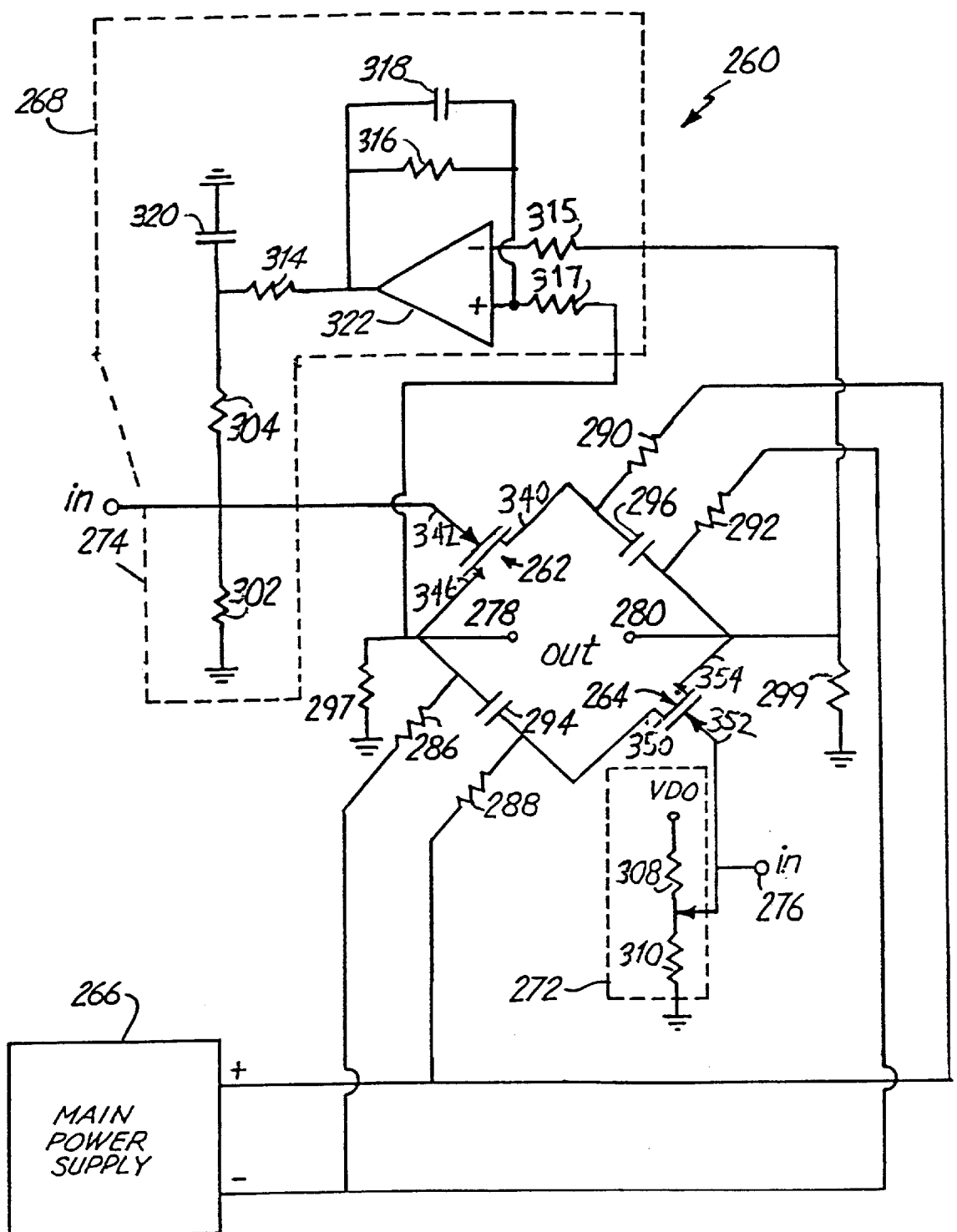
FIG. 4 is a mixed block and circuit schematic diagram representation of an alternate embodiment of the preamplifier/amplifier circuit of the present invention.

Another alterative embodiment of the present invention is illustrated in FIG. 4 as audio and instrumentation preamplifier/amplifier circuit 260. Circuit 260 includes first and second n-channel enhancement MOSFETs 262 and 264. Circuit 260 also includes power supply 266, servo and biasing circuit 268, and fixed biasing circuit 272. Circuit 260 further includes first and second input terminals 274 and 276, which again in operation are connected to an input signal source, and first and second output terminals 278 and 280 between which in operation an output load will be placed. Finally, circuit 260 includes first, second, third and fourth decoupling resistors 286, 288, 290, and 292, first and second decoupling voltage maintenance capacitors 294 and 296 and first and second output resistors 297 and 299.

Power supply 266 is a floating fixed polarity supply similar to power supply 66 of FIG. 2.

MOSFET 262 includes drain 340, gate 342 and source 346. Second MOSFET 264 includes drain 350, gate 352 and source 354.

Gate 342 of first MOSFET 262 is connected to first input terminal 274. Drain 340 of first MOSFET 262 is connected to first output terminal 278 and to one side of second decoupling voltage maintenance capacitor 296. Source 346 of first MOSFET 262 is connected to one side of first decoupling voltage maintenance capacitor 294. Gate 352 of second MOSFET 264 is connected to fixed bias 272. Drain 350 of second MOSFET 264 is connected to second output terminal 280 and to one side of first decoupling voltage maintenance capacitor 294. Source 354 of second MOSFET 264 is connected to one side of second decoupling capacitor 296.

The inputs of servo and biasing circuit 268 are connected between first and second output terminals 278 and 280 across the load. Circuit 268 has its output connected to first input terminal 274. Circuit 268 includes first, second, third, fourth, fifth and sixth servo resistors 302, 304, 314, 315, 316 and 317, first and second filter capacitors 318 and 320, and operational amplifier 322.

First decoupling voltage maintenance capacitor 294 is connected between source 346 of first MOSFET 262 and second output terminal 280. Second decoupling voltage maintenance capacitor 296 is connected between source 354 of MOSFET 264 and first output terminal 278.

First output resistor 297 is connected between first output terminal 278 and ground. Second output resistor 299 is connected between second output terminal 280 and ground. A load (not shown in FIG. 4) is placed across output terminals 278 and 280.

The operation of circuit 260 is similar to the operation of circuit 160 of FIG. 3 and of circuit 60 of FIG. 2. As is apparent to one skilled in the art, the active elements of the previous designs have been replaced by transistors in this embodiment. Circuit 260 has some of the same advantages as circuit 60. Electrostatic noise produced at power supply 266 does not produce noticeable amounts of noise at first and second output terminals 278 and 280 for similar reasons as in circuit 60. Circuit 260 also corrects time average voltage offsets across the load at first and second output terminals 278 and 280 in a manner similar to circuit 60.

Although the present invention has been described with reference to preferred embodiments, workers skilled in the art will recognize that changes may be made in form and detail without departing from the spirit and scope of the invention. For example, multiple circuits like circuit 60 could be built and operated off of a single power supply such as power supply 66. As long as decoupling elements such as decoupling resistors 86, 88, 90 and 92 and decoupling capacitors 94 and 96 are used, the benefits of the invention are achieved.

What is claimed is:

1. A circuit for use as an amplifier comprising:
   first and second input terminals configured to receive first and second input signals;
   first and second active devices each having first and second terminating regions and a control region by which it is capable of being directed to provide a conductive path between the first and second terminating regions, wherein the control region of the first active device is coupled to the first input terminal and the control region of the second active device is coupled to the second input terminal;
   first and second output terminals at which first and second output signals are provided, wherein the first output terminal is coupled to the first terminating region of the first active device and the second output terminal is coupled to the first terminating region of the second active device;
   a first decoupling network connecting a supply of fixed polarity voltage that is not otherwise connected in the circuit to the first output terminal and to the second terminating region of the second active device; and
   a second decoupling network connecting the supply of fixed polarity voltage to the second output terminal and to the second terminating region of the first active device.

2. The circuit of the claim 1 wherein the first decoupling network includes first and second decoupling resistors and first decoupling capacitor and wherein the second decoupling network includes third and fourth decoupling resistors and second decoupling capacitor.

3. The circuit of the claim 2 wherein the first decoupling capacitor is coupled between the first output terminal and the second terminating region of the second active device, and the second decoupling capacitor is coupled between the second output terminal and the second terminating region of the first active device.

4. The circuit of claim 1 wherein the first and second active devices are first and second electron tubes, respectively, and wherein the first and second terminating regions are a cathode and a plate, respectively, and wherein the control region is a grid.

5. The circuit of claim 1 wherein the first and second active devices are first and second transistors.

6. The circuit of claim 5 wherein the first and second transistors are first and second MOSFETs, respectively, and wherein the first and second terminating regions are a source and a drain, respectively and wherein the control region is a gate.

7. The circuit of claim 1 further comprising a servo bias circuit, the servo bias circuit coupled between the first and second output terminals, and to one of the first or second input terminals.

8. The circuit of claim 1 further comprising a servo bias circuit, the servo bias circuit coupled between the first and second output terminals, and to the second input terminal.

9. The circuit of claim 7 wherein the servo bias circuit includes an amplifier that detects offset at the first and second output terminals and wherein the servo bias circuit feeds back an error voltage to the second input terminal to correct the offset.

10. A circuit for use as an amplifier comprising:
    first and second input terminals configured to receive first and second input signals;
    first and second active devices each having first and second terminating regions and a control region by which it is capable of being directed to provide a conductive path between the first and second terminating regions, wherein the control region of the first active device is coupled to the first input terminal and the control region of the second active device is coupled to the second input terminal;
    first and second output terminals at which first and second output signals are provided, wherein the first output terminal is coupled to the first terminating region of the first active device and the second output terminal is coupled to the first terminating region of the second active device;
    a supply of fixed polarity voltage that is solely connected to the first output terminal, the second terminating region of the second active device, the second output terminal, and the second terminating region of the first active device; and
    a servo bias circuit including an amplifier, the servo bias circuit coupled to both the first and second output terminals and to one of the first or second input terminals.

11. The circuit of claim 10 further comprising a decoupling network, the decoupling network connecting the supply of fixed polarity voltage to the first output terminal, to the second terminating region of the second active device, to the second output terminal and to the second terminating region of the first active device.

12. The circuit of the claim 11 wherein the decoupling network includes first, second, third, and fourth decoupling resistors and first and second decoupling capacitors.

13. The circuit of the claim 12 wherein the first decoupling capacitor is coupled between the first output terminal and the second terminating region of the second active device, and the second decoupling capacitor is coupled between the second output terminal and the second terminating region of the first active device.

14. The circuit of claim 10 wherein the first and second active devices are first and second electron tubes, respectively, and wherein the first and second terminating regions are a cathode and a plate, respectively, and wherein the control region is a grid.

15. The circuit of claim 10 wherein the first and second active devices are first and second transistors, respectively.

16. A circuit for use as an amplifier comprising:
first and second input terminals configured to receive first and second balanced input signals;
first and second means for controlling current, each having first and second terminating regions and a control region, the control region for controlling conductivity between the first and second terminating regions, the control region of the first means for controlling current coupled to the first input terminal and the control region of the second means for controlling current coupled to the second input terminal;
first and second output terminals for receiving output signals, the first and second output terminals coupled to the first and second means for controlling current; and
means for connecting, a floating power supply to the first and second output terminals, and to the first and second means for controlling current.

17. The circuit of claim 16 wherein the first and second means for controlling current are first and second electron tubes, respectively, and wherein the first and second terminating regions are cathode and plate, respectively and wherein the control region is a grid.

18. The circuit of claim 16 wherein the first and second means for controlling current are first and second transistors respectively.

19. The circuit of claim 16 wherein the first output terminal is coupled to the first terminating region of the first means for controlling current and the second output terminal is coupled to the first terminating region of the second means for controlling current, and wherein the means for connecting connects the floating power supply to the second terminating region of both the first and second means for controlling current.

20. The circuit of claim 16 wherein the first output terminal is coupled to the first terminating region of the first means for controlling current and the second output terminal is coupled to the first terminating region of the second means for controlling current, and wherein the means for connecting connects the floating power supply to the first terminating region of both the first and second means for controlling current.

21. The circuit of claim 16 wherein the floating power supply includes a transformer.

* * * * *